United States Patent
Sano (10) Patent No.: US 6,264,097 B1
(45) Date of Patent: Jul. 24, 2001

(54) METHOD FOR FORMING A SOLDER BALL (75) Inventor: Yasushi Sano, Chiba (JP)

(73) Assignee: Micro-Tec Company, Ltd., Urayasu (JP)

(*) Notice: Subject to any disclaimer, the term of this patent is extended or adjusted under 35 U.S.C. 154(b) by 0 days.

(21) Appl. No.: 09/596,552

(22) Filed: Jun. 19, 2000

(30) Foreign Application Priority Data

Sep. 6, 1999 (JP) .................................................. 11-252100

(51) Int. Cl.$^7$ ............................ B23K 31/02; H01L 21/441
(52) U.S. Cl. ................... 228/245; 228/246; 228/180.22; 438/613; 438/614
(58) Field of Search ..................................... 228/254, 245, 228/246, 180.22, 215, 4.1, 21, 39, 41, 248.1; 438/613, 614; 257/737, 738; 427/96

(56) References Cited

U.S. PATENT DOCUMENTS

| | | | |
|---|---|---|---|
| 5,130,779 | * | 7/1992 | Agarwala et al. ...................... 357/67 |
| 5,234,149 | * | 8/1993 | Katz et al. .......................... 228/123.1 |
| 5,534,127 | * | 7/1996 | Sakai .................................... 205/125 |
| 5,545,465 | * | 8/1996 | Gaynes et al. ........................ 428/209 |
| 5,586,715 | * | 12/1996 | Schwiebert et al. .............. 228/248.1 |
| 5,597,110 | * | 1/1997 | Melton et al. ......................... 228/203 |
| 5,640,051 | * | 6/1997 | Tomura et al. ........................ 257/778 |
| 5,641,990 | * | 6/1997 | Chiu ....................................... 257/737 |
| 5,672,260 | * | 9/1997 | Carey et al. .......................... 205/118 |
| 5,735,452 | * | 4/1998 | Yu et al. ............................... 228/254 |
| 5,766,674 | * | 6/1998 | Hirowsawa ............................. 427/96 |
| 5,803,344 | * | 8/1998 | Stankavich et al. ............. 228/180.22 |
| 5,914,274 | * | 6/1999 | Yamaguchi et al. .................. 438/690 |
| 5,938,106 | * | 8/1999 | Pierson ................................. 228/246 |
| 6,000,603 | * | 12/1999 | Koskenmaki et al. ................ 228/246 |
| 6,005,399 | * | 12/1999 | Frederickson et al. ............... 324/693 |
| 6,094,832 | * | 8/2000 | Regner et al. .......................... 33/562 |
| 6,099,935 | * | 8/2000 | Brearley et al. ...................... 428/119 |
| 6,109,507 | * | 8/2000 | Yagi et al. ....................... 228/180.22 |

* cited by examiner

Primary Examiner—Tom Dunn
Assistant Examiner—Colleen P. Cooke (57) ABSTRACT

This invention provides screen printing for forming a higher solder ball (bump). In first printing step, a first solder layer is printed. After drying in drying step, a second solder layer is printed on the first solder layer in second printing step. Then, in re-flow processing step, re-flow processing is performed, and the first solder layer and the second solder layer are melted. Finally, the melted layer is solidified in a ball shape to form the solder ball (bump). Since solder paste is printed in layers, an amount of the solder paste can be increased. Hence, a higher solder ball (bump) can be formed.

5 Claims, 13 Drawing Sheets

| PRINTING CONDITION | 1ST PRINTING STEP (S10) | 2ND PRINTING STEP (S30) |
|---|---|---|
| SIZE OF OPENING OF PRINTING MASK | D | D |
| THICKNESS OF PRINTING MASK | W | W |
| VISCOSITY OF SOLDER PASTE | N | N |

| PRINTING CONDITION | 1ST PRINTING STEP (S10) | 2ND PRINTING STEP (S30) |
|---|---|---|
| SIZE OF OPENING OF PRINTING MASK | D1 (LARGE) | D2 (SMALL) |
| THICKNESS OF PRINTING MASK | W | W |
| VISCOSITY OF SOLDER PASTE | N | N |

| PRINTING CONDITION | 1ST PRINTING STEP (S10) | 2ND PRINTING STEP (S30) |
|---|---|---|
| SIZE OF OPENING OF PRINTING MASK | D | D |
| THICKNESS OF PRINTING MASK | W1 (THIN) | W2 (THICK) |
| VISCOSITY OF SOLDER PASTE | N1 (HIGH) | N2 (LOW) |

| PRINTING CONDITION | 1ST PRINTING STEP (S10) | 2ND PRINTING STEP (S30) |
|---|---|---|
| SIZE OF OPENING OF PRINTING MASK | D1 (LARGE) | D2 (SMALL) |
| THICKNESS OF PRINTING MASK | W1 (THIN) | W2 (THICK) |
| VISCOSITY OF SOLDER PASTE | N1 (HIGH) | N2 (LOW) |

Fig.11

| PRINTING CONDITION | | |
|---|---|---|
| | 1ST PRINTING STEP (S10) | 2ND PRINTING STEP (S30) |
| SIZE D OF OPENING OF PRINTING MASK | 0.8mm | 0.7mm |
| THICKNESS W OF PRINTING MASK | 0.25mm | 0.25mm |
| VISCOSITY N OF SOLDER PASTE | SAME | |

| SOLDER BALL OF BGA | |
|---|---|
| PITCH P OF SOLDER BALL | 1.0mm |
| DIAMETER B OF SOLDER BALL | 0.5mm |
| HEIGHT H OF SOLDER BALL | 0.4mm |

METHOD FOR FORMING A SOLDER BALL

BACKGROUND OF THE INVENTION

1. Field of the Invention

This invention relates to a method for forming or creating a solder ball on a substrate or circuit board (work), e.g., BGA (Ball Grid Array), etc.

2. Description of the related Art

Figure 12:
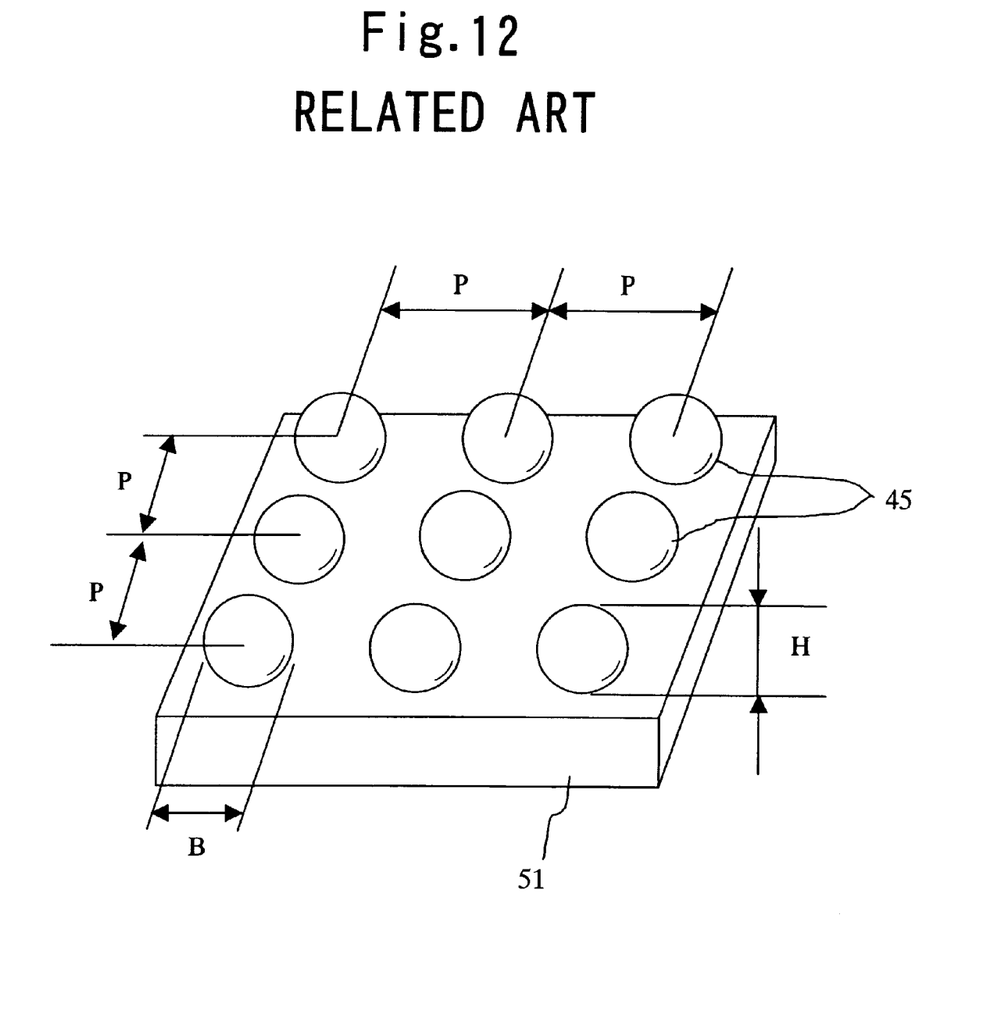
FIG. 12 illustrates a perspective view of the BGA.

FIG. 12 illustrates a perspective view of a BGA 51.

A plurality of solder balls 45 (bumps) is arranged on the BGA 51. The solder balls 45 (bumps) are arranged with an equal interval, i.e., a determined pitch P. As a method for forming the solder balls 45 (bumps), a known method of screen printing solder paste on an electrode of a work uses a printing mask and forms the solder balls (bumps) on the electrode by re-flow processing of the solder paste. Due to recent increases in the density of electronic parts and decreased pitch P of the solder balls (bumps), there are now more requests for reducing a size of an opening of the printing mask.

When the BGA 51 is attached to another substrate or circuit board by soldering, a height H of the solder balls (bumps) should be higher. If the height H of the solder balls (bumps) is higher, a difference in a height of the substrate or circuit board, to which the BGA 51 is attached by soldering, due to cambering and curbing of the substrate or circuit board can be better absorbed. A difference in a height on a surface of the substrate or circuit board due to cambering and curbing of the substrate or circuit board of the BGA 51 can also be better absorbed. Further, a difference in thermal expansion can be absorbed. Hence, all the solder balls 45 (bumps) can be electrically connected without failure. Therefore, an amount of the solder paste coated on the electrode of the BGA 51 must be increased as much as possible, and the height H of the solder balls (bumps) must be made higher.

Figure 13:
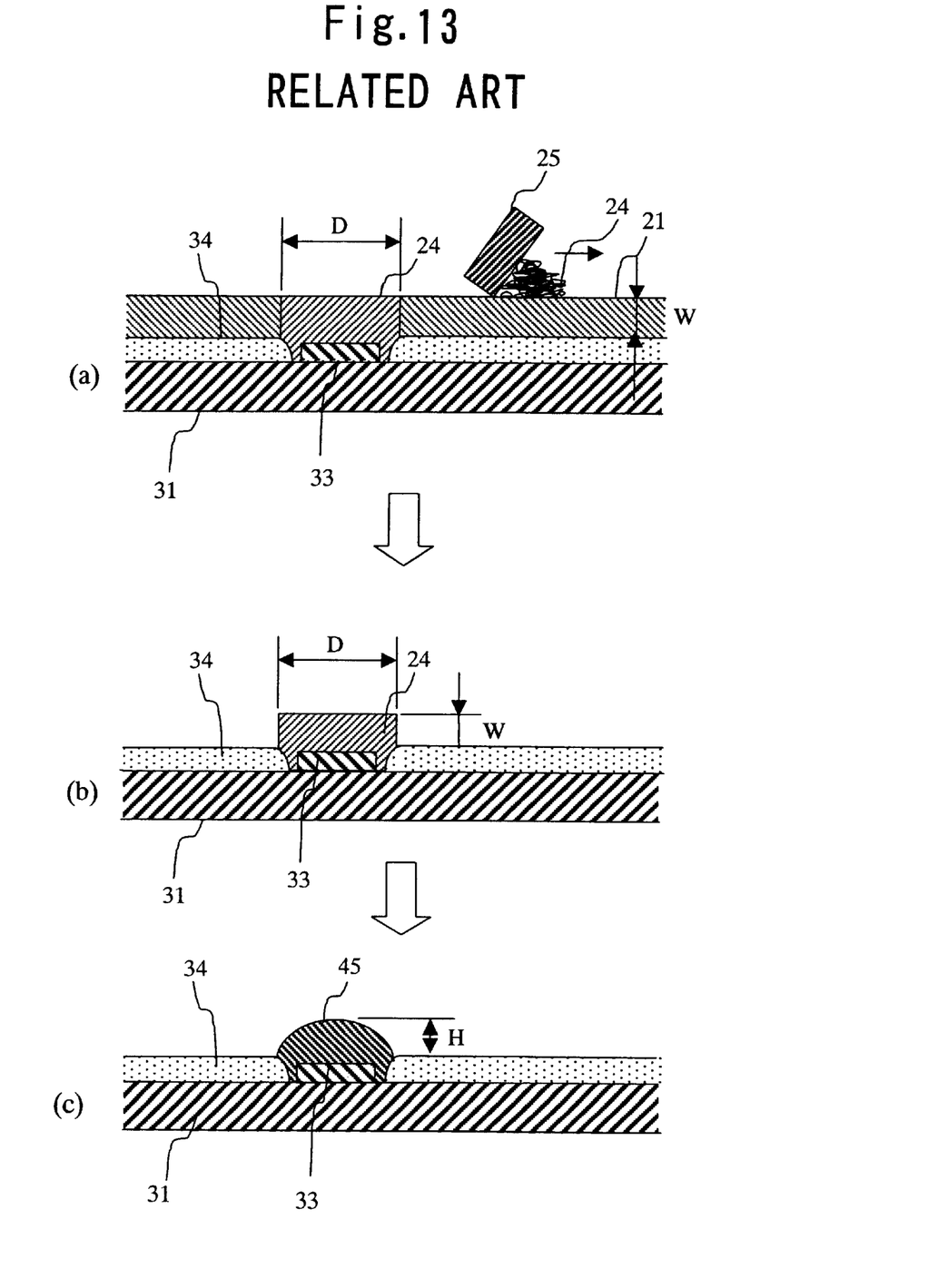
FIG. 13 illustrates a method for forming the solder ball (bump) according to the related art.

FIG. 13 illustrates a procedure of forming the solder balls 45 (bumps) by screen printing according to the related art. An electrode 33 is provided on a work 31,and a resist 34 is provided around the electrode 33. An opening 23 of a printing mask 21 is provided to correspond to the electrode 33. When the printing mask 21 is placed on the work 31 and a squeegee 25 is moved in a direction of the arrow, solder paste 24 is printed on a surface of the work 31.

In FIG. 13, (a) shows a printing state, and (b) shows a state after printing when the printing mask 21is detached from the work 31. In FIG. 13, (c) shows a state in which the solder ball 45 (bump) is formed from the solder paste 24 by re-flow processing. For increasing a height H of the solder ball (bump) in (c), a thickness W of the printing mask in (a) must be increased. However, when the thickness W of the printing mask is increased, side walls of the printing mask and the solder paste 24 stick to each other more firmly. Therefore, when the printing mask 21 is detached from the work 31, the solder paste 24 is also detached from the work 31. As a result, the solder paste 24 does not remain on the work 31, and a printing condition becomes insufficient. When the thickness W of the printing mask is increased, it is possible to lower a viscosity of the solder paste 24 to solve this problem. However, when the viscosity of the solder paste 24 is lowered, the solder paste 24 spreads around the electrode 33 after screen printing and contacts with adjacent solder paste. This causes problems, e.g., a failure in an electric connection, generation of a solder bridge, etc.

SUMMARY OF THE INVENTION

According to a preferred embodiment of this invention, when a solder ball (bump) is formed on a work by screen printing, an amount of the solder paste coated on an electrode of the work is increased as much as possible for forming a higher solder ball (bump).

Further, according to a method for forming a solder ball (bump) in this invention, even if the amount of the solder paste is increased as much as possible, the solder bridge does not tend to be generated.

According to one aspect of this invention, a method is provided for forming a solder ball, in which the solder ball is formed on an electrode of a work by using a solder paste. The method includes forming a first solder layer by placing a first solder paste on the electrode of the work, forming a second solder layer by placing a second solder paste on the first solder layer formed on the electrode of the work after forming the first solder layer, and forming the solder ball by heating, melting and solidifying the first solder layer and the second solder layer in re-flow processing after forming the second solder layer.

Further features and applications of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Other objects features, and advantages of the invention will be apparent from the following description when taken in conjunction with the accompany drawings.

DETAILED DESCRIPTION OF THE PREFERRED EMBODIMENTS

Embodiment 1

Figure 1:
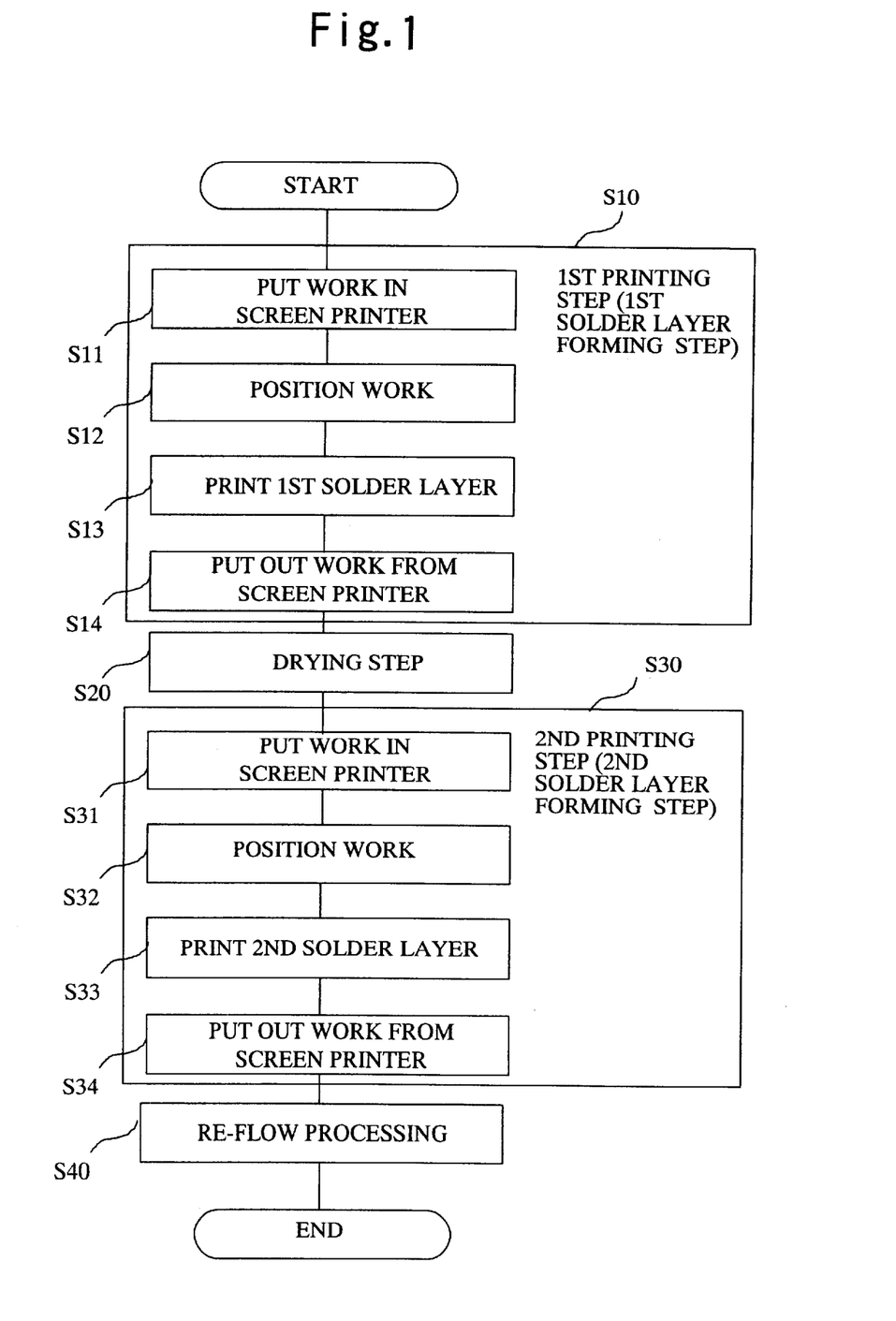
FIG. 1 shows a flow chart of a method for forming a solder ball (bump) according to an embodiment of this invention.

FIG. 1 shows a flow chart of operations in a method for forming or generating a solder ball (bump) in an embodiment of this invention.

Figure 2:
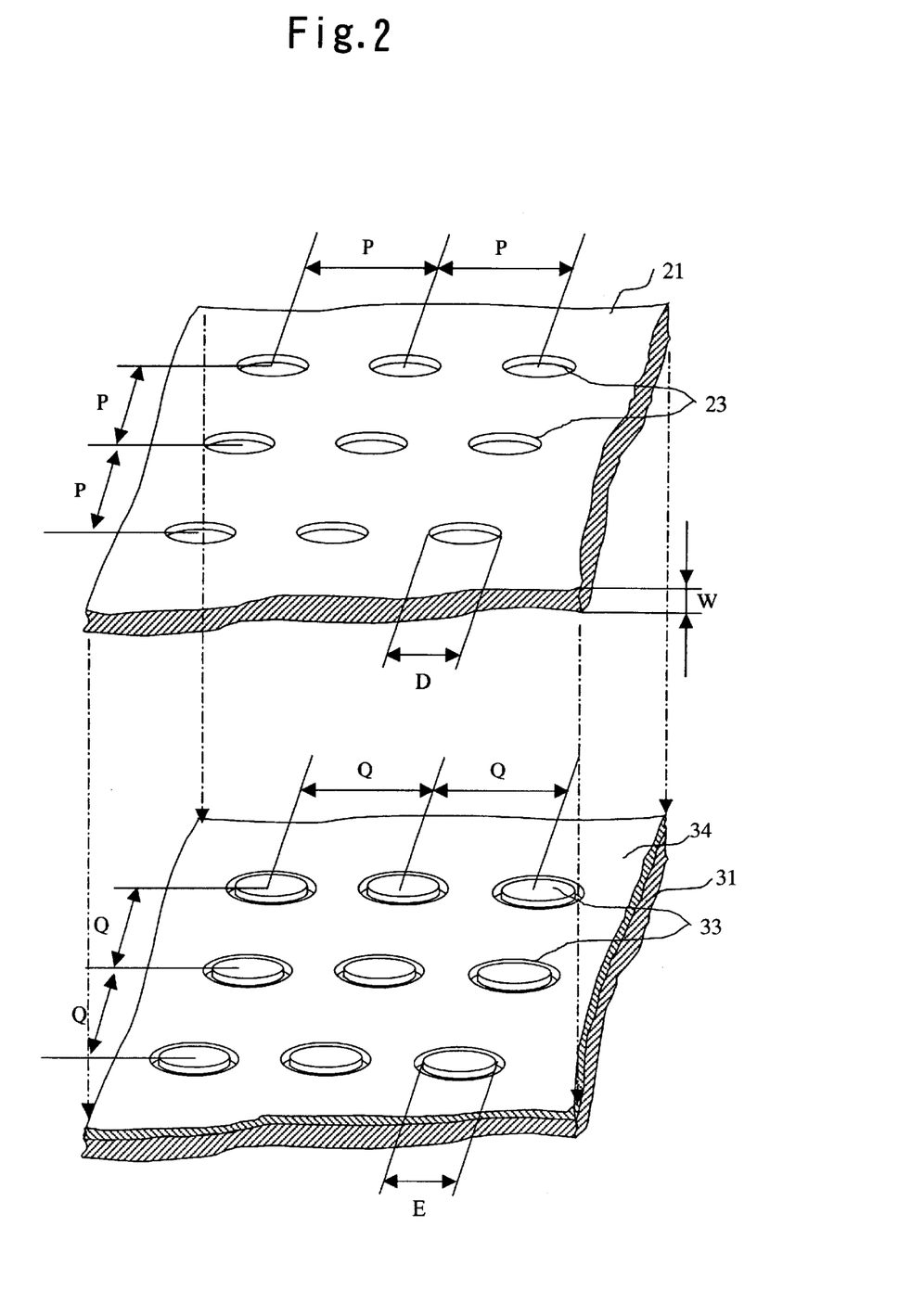
FIG. 2 illustrates a partial perspective view of the printing mask 21 and the work 31.

FIG. 2 illustrates a partial perspective view of the printing mask 21 and the work 31.

Figure 3:
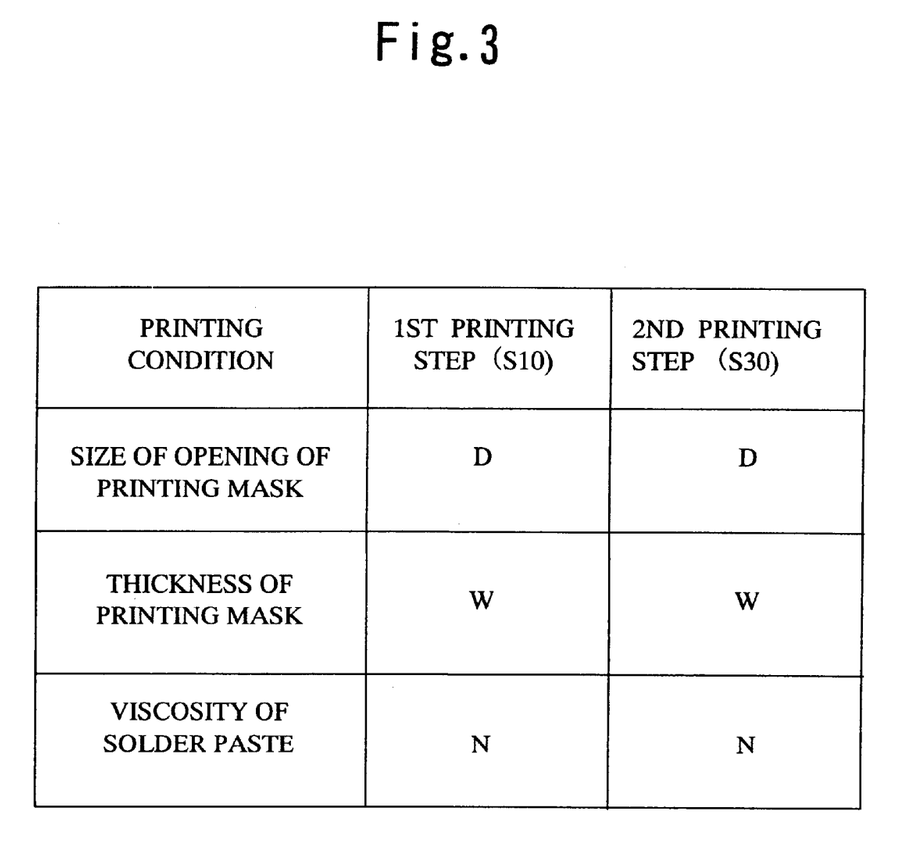
FIG. 3 shows a printing condition in embodiment 1.

FIG. 3 shows a comparison chart of conditions of printing in first printing step S10 and second printing step S30.

Figure 4:
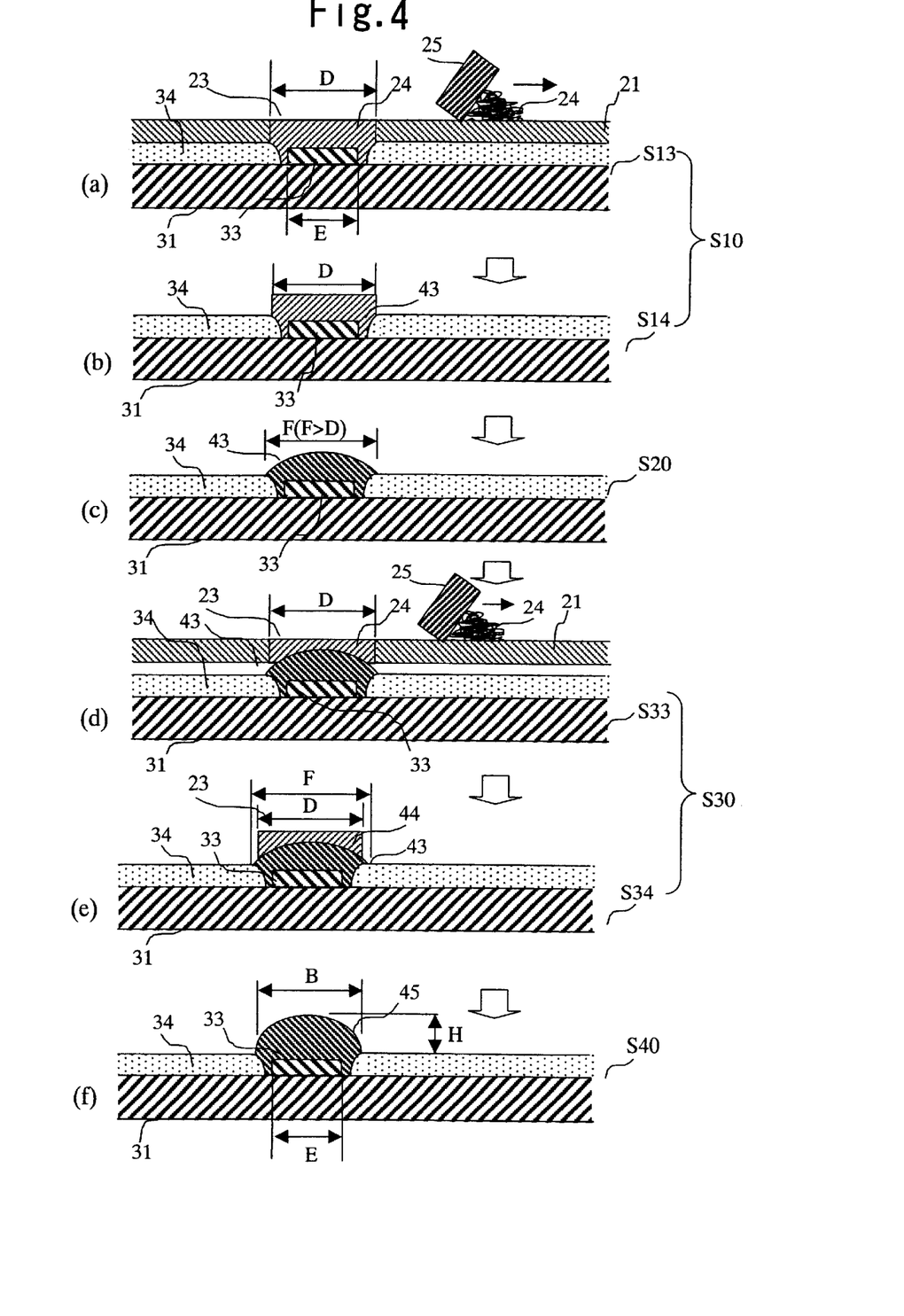
FIG. 4 illustrates a state in each step of embodiment 1.

FIG. 4 illustrates a state in each step.

As illustrated in FIG. 2, a plurality of electrodes 33 is exposed on the work 31. The electrodes 33 have equal diameter E and are arranged with an equal pitch Q. The printing mask 21 includes a plurality of openings 23 corresponding to the electrodes 33. As the printing mask 21, a metal mask or plastic mask without mesh is desired. More solder paste can be printed by using a mask without mesh than using a mask with mesh. The openings 23 have an equal size D, and are arranged with an equal pitch P (P=Q). The size D of the openings of the mask may be equal to the diameter E of the electrode, but it is not necessary. To increase the amount of the solder paste printed, the size D of the openings of the mask should be larger. However, when the opening size D is too large, the solder paste for adjacent openings tends to be connected, and a problem, e.g., the solder bridge, can occur. A thickness W of the printing mask should be thicker as far as the solder paste can remain on the electrodes 33. The thickness W of the printing mask, the size D of the openings of the printing mask, and a viscosity N of the solder paste have a relative relation. Therefore, when one of values (W, D, or N) is changed, values of the others often must be changed.

In embodiment 1, printing conditions in first printing step S10 and second printing step S30 are assumed to be equal as illustrated in FIG. 3. In both of first printing step S10 and second printing step S30, the same printing mask and the same solder paste are supposed to be used.

With reference to FIGS. 1 and 4, operations are explained in detail.

In first printing step S10, the work is put in a screen printer in step S11. In step S12, the work is positioned on a table of the screen printer. In step S13, screen printing is performed on the work by using the printing mask 21. This printing state is illustrated in (a) of FIG. 4. By this printing operation, the solder paste 24 is printed on the electrode 33. Then, in step S14, the work is removed from the screen printer. In (b) of FIG. 4, a first solder layer 43 is formed on the work 31 after screen printing. Then, since the solder paste is liquid (paste), the solder paste spreads around, and a size F of the first solder layer 43 exceeds the size D of the opening of the printing mask.

In drying step S20, the work 31, which was screen printed, is dried. By drying, the solder paste spreading around the electrode 33 hardens as illustrated in (c) of FIG. 4. In (c) of FIG. 4, the size F of the first solder layer increases and exceeds the size D of the opening of the printing mask by 10% to 20% approximately. If the viscosity of the solder paste 24 is higher, the increase of the size is smaller. If the viscosity is lower, the increase is larger. When the size F of the first solder layer is too large, the first solder layer tends to contact with another first solder layer. This causes generation of the solder bridge. Therefore, the size D of the opening of the printing mask and the viscosity N of the solder paste must be predetermined based on the size F of the first solder layer which will be formed after drying step S20.

The operations performed in steps S11–S14 of first printing step S10 are also performed in steps S31–S34 of the second printing step S30. In work positioning step S32, the work is positioned accurately so that the opening 23 of the printing mask 21 is positioned on the work at the same previous printing position. In (d) of FIG. 4, a state of printing a second solder layer in step S33 is illustrated. In (e) of FIG. 4, a state after screen printing is illustrated. In (e) of FIG. 4, a second solder layer 44 remains on the first solder layer 43. Since the first solder layer 43 is in a dome shape and the opening 23 of the printing mask 21 is placed on the first solder layer 43, a top of the first solder layer 43 in the dome shape is squeezed or inserted into the opening 23 of the printing mask. Therefore, only a part of a whole capacity of the opening 23 of the printing mask 21 is filled with the solder paste 24. If the whole capacity of the opening 23 of the printing mask 21 is assumed to be 1.0, approximately 0.5 of the whole capacity is filled with the solder paste, and printing is performed.

In re-flow processing step S40, re-flow processing is performed. The first solder layer 43 and the second solder layer 44 are heated in re-flow processing and melted to be united. Then, when the melted solder layer is cooled and solidified, the solder ball (bump) 45 in a ball shape is formed by a surface tension. Since printing is performed in two layers, an amount of the solder paste is approximately one and one half times of the amount in the related art, and a height H of the solder ball (bump) becomes higher.

Further, since the second solder layer 44 is printed on the first solder layer 43 and the first solder layer 43 and the second solder layer 44 are made of the same solder paste, the first solder layer 43 and the second solder layer 44 tend to stick to each other. Hence, when printing the second solder layer 44 on the first solder layer 43, it is very unlikely that the second solder layer 44 will spread beyond the size F of the first solder layer, because a solvent used in the second solder layer 44 is easily absorbed in the first solder layer 43 which is dry and solid. Therefore, even if the second solder layer 44 tries to spread around, the second solder layer 44 does not easily spread around, and the second solder layer 44 is printed and piled only on the first solder layer 43 without spreading. Accordingly, even if the amount of the solder paste becomes one and one-half times, the solder paste does not spread beyond the size F of the first solder layer, and there is less possibility of generating the solder bridge.

Embodiment 2

Figure 5:
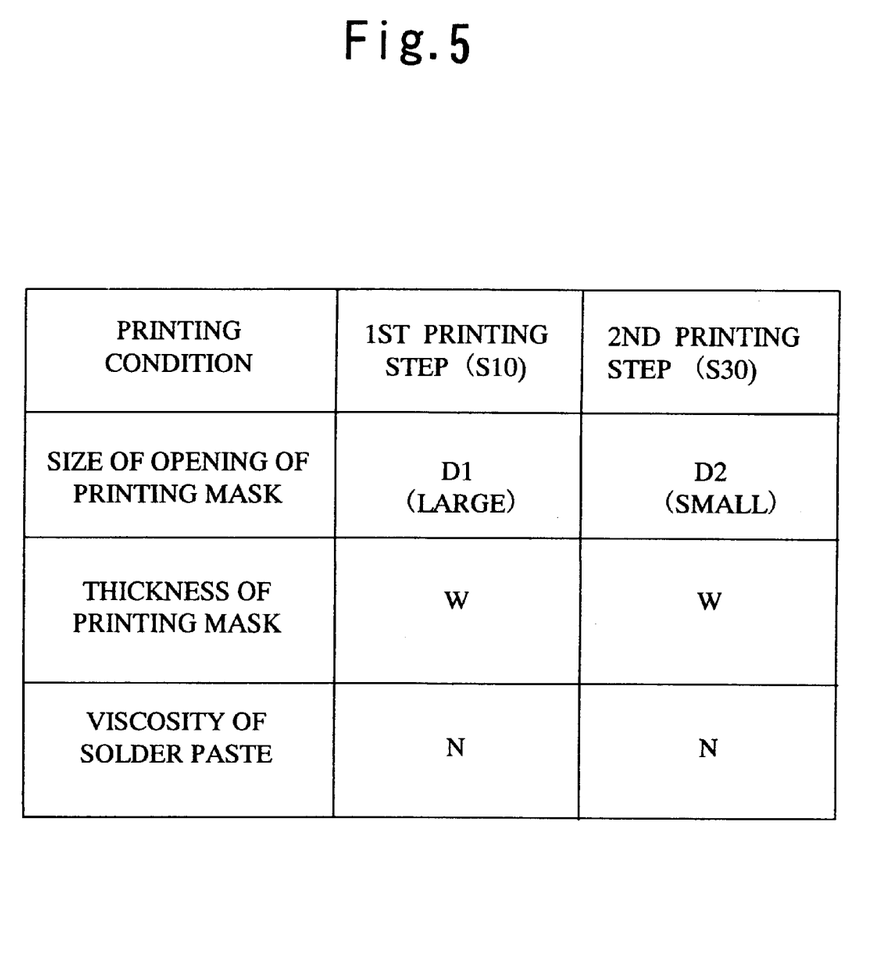
FIG. 5 shows a printing condition in embodiment 2.
Figure 6:
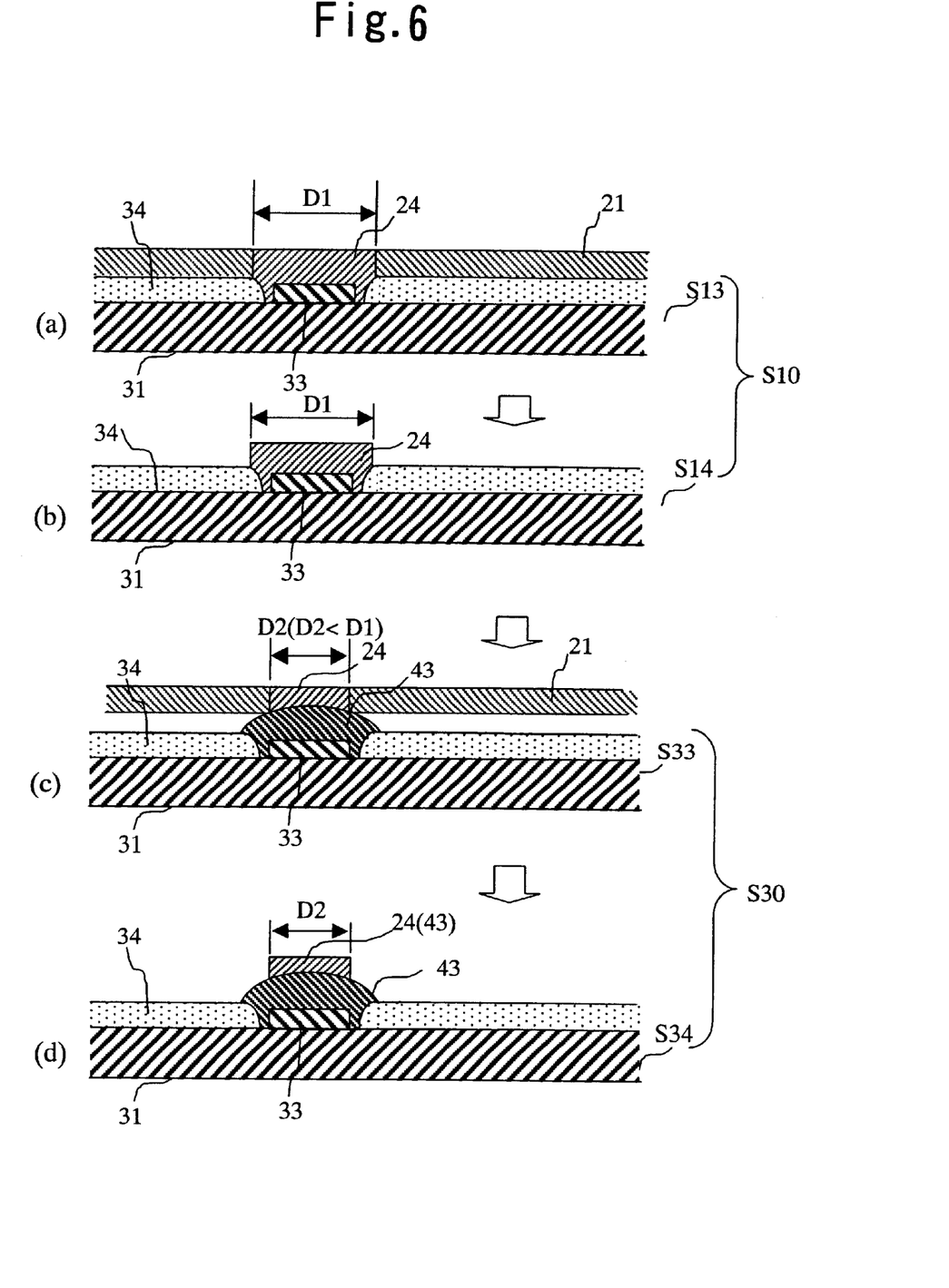
FIG. 6 illustrates a state in each step of embodiment 2.

FIG. 5 shows printing conditions in first printing step S10 and second printing step S30 with the various size D of the opening of the printing mask. As illustrated in FIG. 5, when a size D2 of the opening of the printing mask in to second printing step S30 is reduced from a size D1 of the opening of the printing mask in first printing step S10, much solder paste can be gained in the second printing step. As stated earlier, since the first solder layer 43 is dome-shaped, when the printing mask with the opening of the same size with first printing step S10 is used in second printing step S30, the dome-shaped first solder layer 43 is squeezed or inserted into the opening of the printing mask, and there is a possibility that the amount of the solder paste becomes half. By reducing the size of the opening in second printing step S30, a lesser part of the top of the first solder layer 43 in the dome shape is squeezed into the opening. Hence, the whole capacity of the opening can be almost filled with the solder paste, and more solder paste can be printed.

Figure 7:
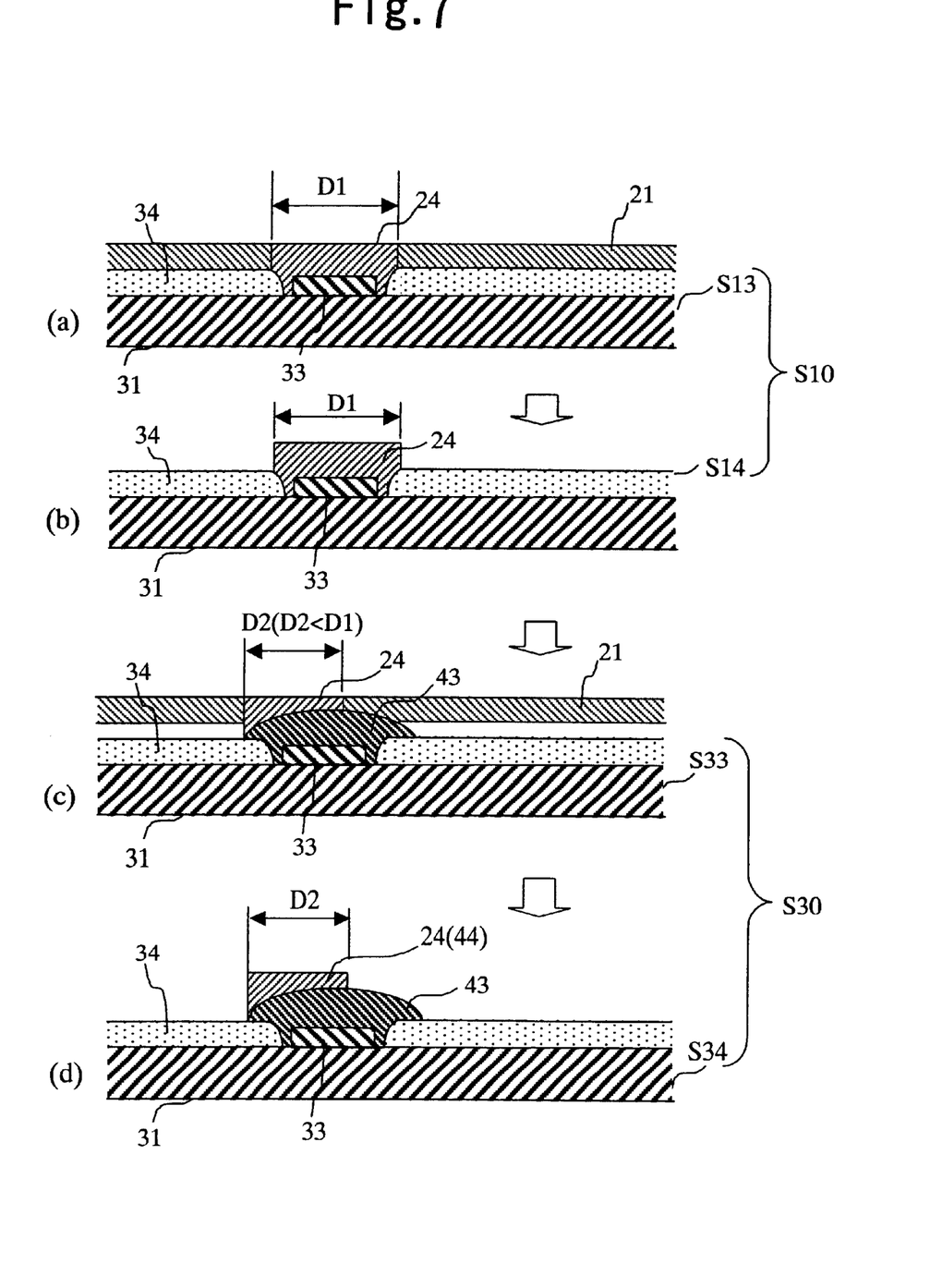
FIG. 7 illustrates a state of layer printing with shifting when a size D of the opening of the printing mask is equal.

As illustrated in FIG. 7, when positioning of the printing mask 21 and the work 31 is not accurate, printing of the solder paste 24 is shifted to one side of the first solder layer 43. However, by reducing the size D2 of the opening of the printing mask in second printing step S30 from the size D1 of the opening of the printing mask in first printing step S10, the solder paste 24 can still be printed on the first solder layer 43.

Embodiment 3

Figure 8:
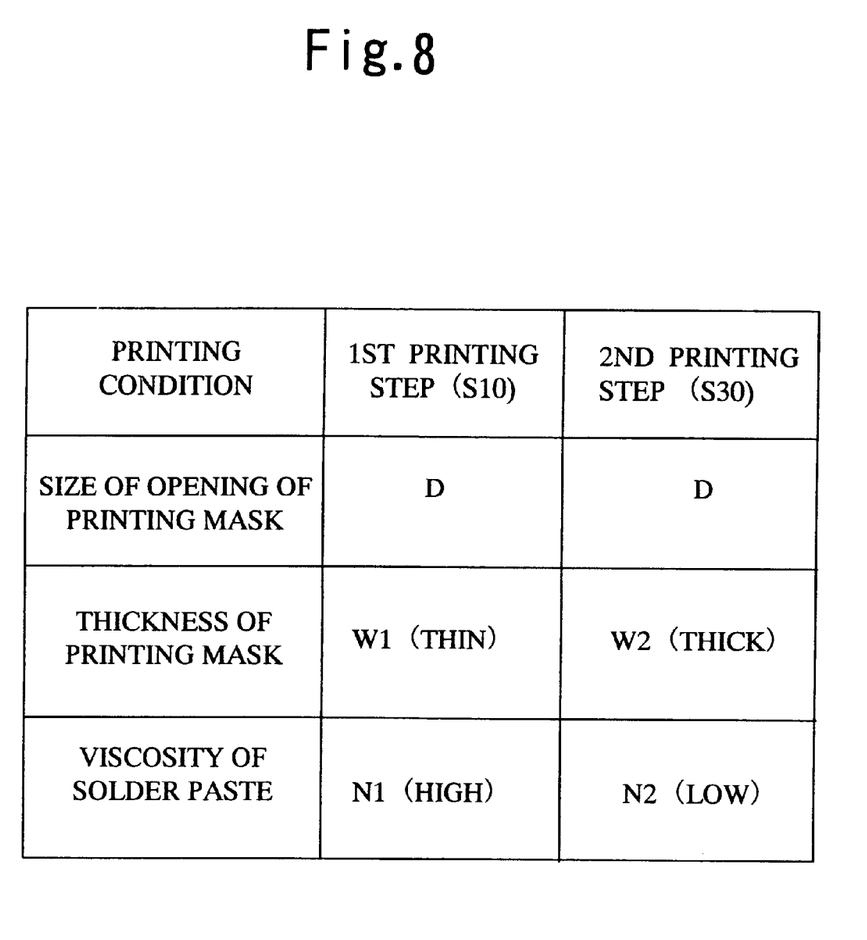
FIG. 8 shows a printing condition in embodiment 3.

FIG. 8 shows printing conditions with the various thickness W of the printing mask and the various viscosity N of the solder paste.

In FIG. 8, a thickness W2 of the printing mask in second printing step S30 is increased from the thickness W1 of the printing mask in first printing step S10 (W1<W2), and a viscosity N2 of the solder paste 27 in second printing step S30 is lowered from a viscosity N1 of the solder paste 24 in first printing step S10 (N1>N2).

Figure 9:
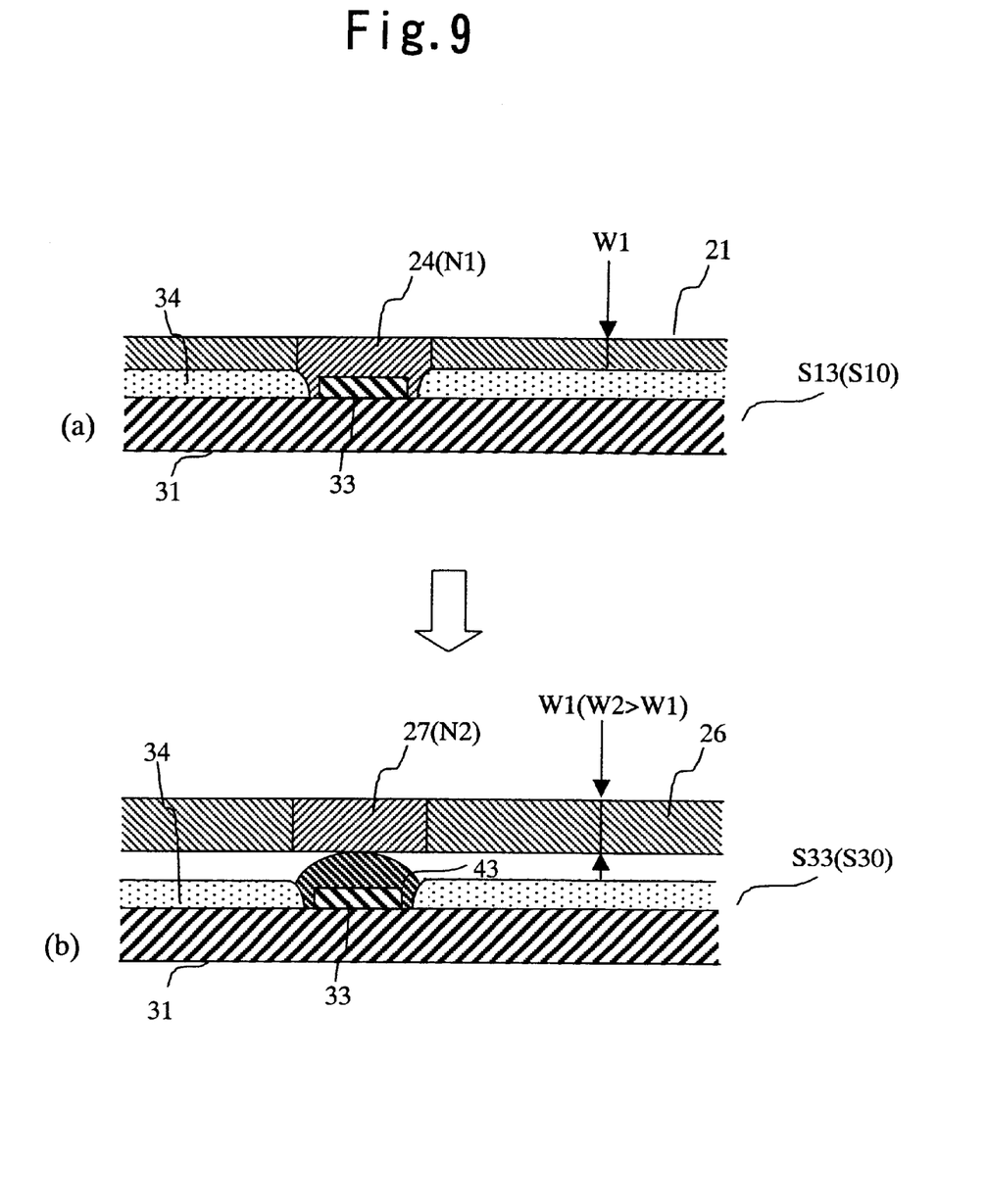
FIG. 9 illustrates a state in each step of embodiment 3.

FIG. 9 illustrates a printing state.

A thickness W2 of the printing mask in (b) of FIG. 9 is thicker than a thickness W1 of the printing mask in (a) of FIG. 9 (W2>W1). As a result, more solder paste can be printed in layers. Since the thickness W2 of the printing mask 26 is increased, the viscosity N2 of the solder paste 27 is lowered (N2<N1). By lowering the viscosity N2 of the solder paste 27 from the viscosity N1 of the solder paste 24, even if the thickness W2 of the printing mask is increased, the solder paste 27 can remain on the first solder layer 43. As stated in embodiment 3, since the solder paste 27 of the second solder layer 44 is printed on the first solder layer 43, even if the thickness W of the printing mask is increased and the viscosity N of the solder paste is lowered, the solder paste 27 sticks to the first solder layer 43 more firmly than to the printing mask 26. Therefore, the solder paste 27 remains on the first solder layer 43 firmly. Further, since the solder paste is printed only on the first solder layer 43, even if the viscosity N of the solder paste is low, the solvent of the solder paste 27 is absorbed in the first solder layer 43. This prevents the solder paste 27 from spreading around the first solder layer 43.

As stated in embodiment 3, the amount of the solder paste can be increased by increasing the thickness W of the printing mask. As a result, a higher solder ball (bump) can be formed.

Embodiment 4

Figure 10:
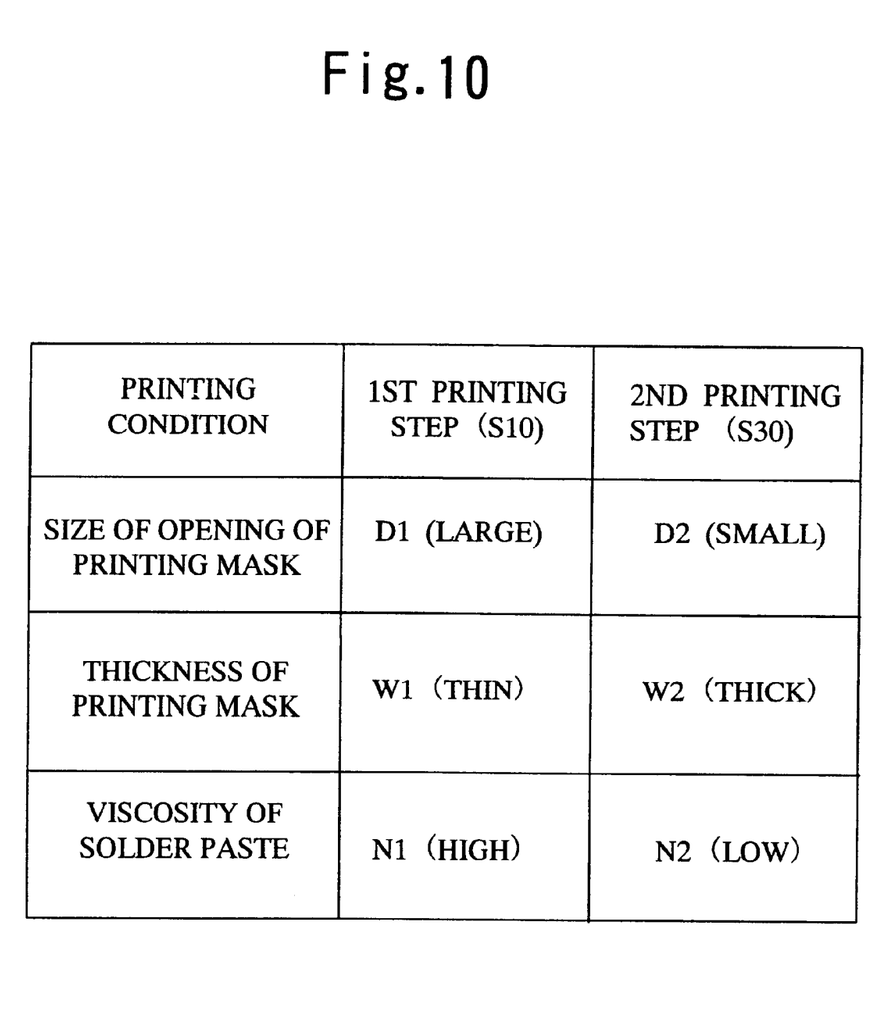
FIG. 10 shows a printing condition in embodiment 4.

In FIG. 10, both embodiment 2 and embodiment 3 are realized. FIG. 10 illustrates conditions with the various size D of the opening of the printing mask, the various thickness W of the printing mask and the viscosity N of the solder paste.

In case of FIG. 10, even if printing position is shifted, a difference in height of the balls (bumps) can be lowered. Therefore, the more solder paste can be printed, and the height of the solder balls (bumps) can be increased.

Even though not illustrated in FIG. 10, it is possible to change only the thickness W of the printing mask or only the viscosity N of the solder paste. It is also possible to change other conditions which are not illustrated in FIG. 10.

For example, a temperature or a time for drying step S20 or re-flow processing step S40 can be changed. Further, the type of solvent may be changed or a composition of the solder paste can be changed.

In the embodiments described above, both the opening 23 and the electrode 33 are circle-shaped. However, they can be in other shapes, e.g., oval, square, polygon, and irregular shape. Further, the shape of the opening 23 and the shape of the electrode 33 need not be the.

In the embodiments described above, the opening 23 and the electrode 33 are arranged regularly. However, they can be arranged randomly.

In the embodiments described above, only the first layer and the second layer are printed. However, it is possible to print a third layer or more than three layers.

In the embodiments described above, the first solder layer 43 and the second solder layer 44 are formed by screen printing. However, the first solder layer 43 and/or the second solder layer 44 can be formed by other printing methods besides screen printing. The first solder layer 43 and/or the second solder layer 44 can be formed by a dispense method and an ink jet method.

In the above-described embodiments, the re-flow processing step S40 may be optional. When the re-flow processing step S40 is omitted, the two-layered bump is used to attach to the circuit board. When the two-layered bump without the re-flow processing step S40 is attached to the circuit board for soldering, the two-layered bump will be melted and soldered to the circuit board.

Figure 11:
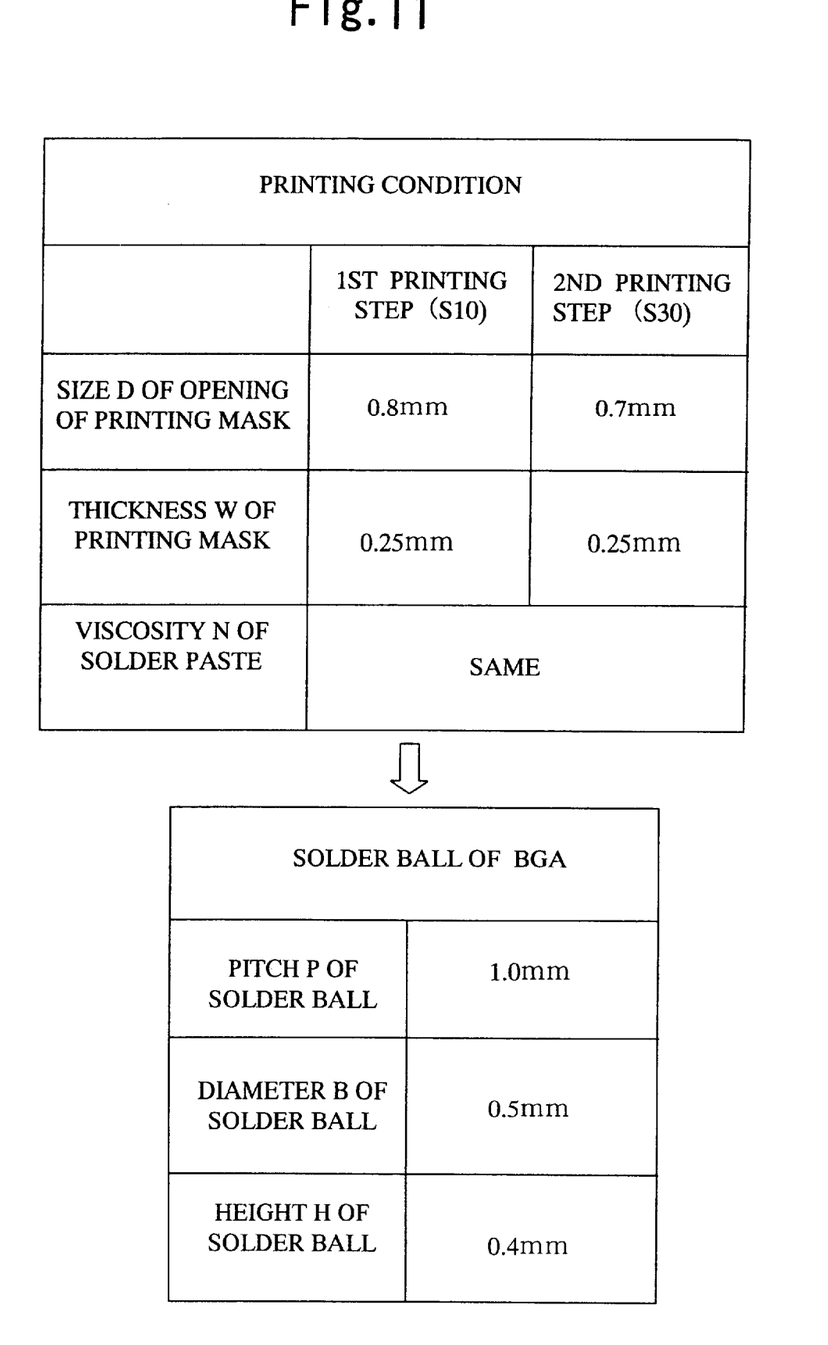
FIG. 11 illustrates an actual example of this invention.

FIG. 11 illustrates an actual example as one of the preferred cases.

In first printing step S10, the size D of the opening of the printing mask is 0.8 mm, and the thickness W of the printing mask is 0.25 mm. In second printing step S30, the size D of the opening of the printing mask is 0.7 mm, and the thickness W of the printing mask is 0.25 mm. In that case, a solder ball (bump) with a pitch P of 1.0 mm, a diameter B of 0.5 mm, and a height H of 0.4 mm can be formed.

Having thus described several particular embodiments of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is limited only as defined in the following claims and the equivalents thereto.

What is claimed is:

1. A method for forming a solder ball, wherein the solder ball is formed on an electrode of a work by using a solder paste, comprising:

forming a first solder layer by placing a solder paste on the electrode of the work;

drying the work so as to harden the solder paste placed on the electrode of the work;

forming a second solder layer by placing a solder paste on the first solder layer formed on the electrode of the work after drying the work; and forming the solder ball by heating, melting and solidifying the first solder layer and the second solder layer in re-flow processing after forming the second solder layer.

2. The method for forming the solder ball of claim 1, wherein forming the first solder layer and forming the second solder layer includes screen printing the solder paste by using a printing mask.

3. The method for forming the solder ball of claim 2, wherein the printing mask used in forming the second solder layer is with a smaller opening than the printing mask used in forming the first solder layer.

4. The method for forming the solder ball of claim 2, wherein the printing mask used in forming the second solder layer is thicker than the printing mask used in forming the first solder layer.

5. The method for forming the solder ball in claim 2, wherein the solder paste used in forming the second solder layer is with a lower viscosity than the solder paste used in forming the first solder layer.

* * * * *